(12) United States Patent
Kaira et al.

(10) Patent No.: US 11,551,956 B2
(45) Date of Patent: Jan. 10, 2023

(54) METHOD AND DEVICE FOR FAILURE ANALYSIS USING RF-BASED THERMOMETRY

(71) Applicant: Intel Corporation, Santa Clara, CA (US)

(72) Inventors: Chandrashekara Shashank Kaira, Chandler, AZ (US); Phillip C. Miller, Chandler, AZ (US); Purushotham Kaushik Muthur Srinath, Chandler, AZ (US); Deepak Goyal, Phoenix, AZ (US)

(73) Assignee: INTEL CORPORATION, Santa Clara, CA (US)

( * ) Notice: Subject to any disclaimer, the term of this patent is extended or adjusted under 35 U.S.C. 154(b) by 362 days.

(21) Appl. No.: 16/911,466

(22) Filed: Jun. 25, 2020

(65) Prior Publication Data

US 2021/0407833 A1 Dec. 30, 2021

(51) Int. Cl.
*H01L 21/67* (2006.01)
*G01J 5/00* (2022.01)

(52) U.S. Cl.
CPC ...... *H01L 21/67288* (2013.01); *G01J 5/0007* (2013.01); *H01L 21/67248* (2013.01)

(58) Field of Classification Search
CPC ......... H01L 21/67288; H01L 21/67248; H01L 22/20; H01L 22/12; G01J 5/0007
See application file for complete search history.

(56) References Cited

U.S. PATENT DOCUMENTS

| 4,965,451 A | * | 10/1990 | Solter | G01N 25/72 |
| | | | | 374/4 |
| 9,500,599 B2 | * | 11/2016 | Mun | G01J 5/047 |
| 2017/0299534 A1 | * | 10/2017 | Nakamura | G01R 31/50 |

* cited by examiner

*Primary Examiner* — Syed I Gheyas
(74) *Attorney, Agent, or Firm* — Viering, Jentschura & Partner MBB (57) ABSTRACT

According to the various examples, a fully integrated system and method for failure analysis using RF-based thermometry enable the detection and location of defects and failures in complex semiconductor packaging architectures. The system provides synchronous amplified RF signals to generate unique thermal signatures at defect locations based on dielectric relaxation loss and heating.

20 Claims, 6 Drawing Sheets

METHOD AND DEVICE FOR FAILURE ANALYSIS USING RF-BASED THERMOMETRY

BACKGROUND

The technology roadmap for the semiconductor industry continues to drive innovation towards heterogeneous computing devices and complex packaging architectures, as well as the increasing use of novel materials and complex process flows. It is possible to have greater design flexibility and augmented performance, through both vertical and horizontal integration, by combining different ground-breaking packaging architectures, such as the use of EMIB (i.e., Embedded Multi-die Interconnect Bridge) and face-to-face chip-on-chip bonding (e.g., Intel's Foveros) as an elegant and cost-effective approach to in-package high density interconnect of heterogeneous chips.

These complex packaging architectures allow for the possibility of "mixing and matching" silicon devices that have varied functionality, and their fabrication may require the use of multiple process nodes that are optimized for the intended function of the device. However, these multi-chiplet integrated architectures include features like active and passive silicon bridges and interposers using TSVs (i.e., Through-Silicon Vias) and DDIs (i.e., Die-to Die Interconnects) that increase interconnect and routing density and may cause significant signal dissipation through these lengthy interconnects. Naturally, defects and failures can and do occur in these packages. Consequently, failure analysis and isolation are critically important in the development and production of these heterogeneous computing devices.

Moreover, as internal input-outputs begin to constitute most of the test pins in heterogeneous computing architectures, it becomes increasingly difficult to isolate process defects and failures in a non-destructive manner. In particular, the presence of branching in routing structures prevents the use of conventional failure isolation (FI) techniques (e.g., using electrical impulses) for defect isolation in electrical open-circuit failures. It is also recognized that destructive FI approaches can be unreliable and have lower chances of locating such failures.

Present FI techniques for such defects are primarily non-visual, have low detection limits in terms of the testable trace length (<2 mm in silicon), have poor defect resolution, and are generally ineffectual in isolating defects in highly branched heterogeneous computing architectures. Specifically, present techniques cannot provide non-destructive dynamic FI for internal low resistance short failures, extremely high resistance or open-circuit failures in heterogeneous computing products. In addition, the existing FI toolsets require long throughput times and do not offer defect isolation along the Z-axis (i.e., depth) for such electrical failures, which is crucial for vertically stacked dies/packages.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the present disclosure. The dimensions of the various features or elements may be arbitrarily expanded or reduced for clarity. In the following description, various aspects of the present disclosure are described with reference to the following drawings, in which.

DETAILED DESCRIPTION

The following detailed description refers to the accompanying drawings that show, by way of illustration, specific details and aspects in which the present disclosure may be practiced. These aspects are described in sufficient detail to enable those skilled in the art to practice the present disclosure. Various aspects are provided for devices, and various aspects are provided for methods. It will be understood that the basic properties of the devices also hold for the methods and vice versa. Other aspects may be utilized and structural, and logical changes may be made without departing from the scope of the present disclosure. The various aspects are not necessarily mutually exclusive, as some aspects can be combined with one or more other aspects to form new aspects.

In the various aspects of the present disclosure, a fully integrated system or device and method for precisely isolating defects and failures in complex semiconductor packaging architectures are provided. From a fundamental perspective, a biased device under test (DUT) may be examined with high-magnification infrared thermography to identify "hot spots" caused by extremely high resistance or open-circuit defects and/or failures using the present device and method. In the present disclosure, the terms "semiconductor package" and "device" are used interchangeably.

In an aspect, synchronous amplified RF signals at optimized frequencies and power (based on the device and type/length of structure being investigated) may be used to generate unique thermal signatures at defect locations that can be located using the present synchronized RF-based thermometry. According to the present disclosure, synchronous thermometry is enabled by modulating the amplitude of the present RF signals at a specific frequency (i.e., chopping the RF signal a specific number of times per second; square wave of RF power modulation) and thermally imaging at the same frequency. The present fully integrated system also provides multiple functionalities that include fine-pitch probing, visualizing signal paths, and using thermal phase measurements to estimate the relative depth of defects/thermal sources in three-dimensional (3D) packages according to the present disclosure.

In another aspect, the fully integrated system may have software controls for the signal synchronization and optimization, for image processing using filters for fine defect resolution to enhance visualization, and for defect localization using advanced algorithms to interpret synchronous thermal data and provide defect isolation with x, y and z coordinates (i.e., 3 dimensions).

According to the present disclosure, the fully integrated system provides rapidly switching electric fields causing permanent and induced molecular dipole moments in the dielectric material located at a defect or failure location, eventually leading to dielectric relaxation. A non-equilibrium delayed polarization behavior may be exhibited by the dielectric in response to the switching electric field, which causes a localized thermal response at the defect. The relaxation is accompanied by "dielectric loss," which is a dielectric material's inherent dissipation of electromagnetic energy (e.g., heat).

According to the present disclosure, by applying an amplified and synchronous continuously alternating high-frequency RF signal (i.e., not a pulsed signal) across a structure in a DUT, dielectric relaxation loss may be induced at the defect location due to the rapidly switching applied electric field, which leads to heating within the dielectric material. A thermal signature may be generated and distinctly isolated with great precision (i.e., within a few μm).

In an aspect, the thermal energy dissipated is directly related to the capacitance of the dielectric at the defect location. The typical nature of semiconductor defects leads to a large capacitance at the open-circuit defect location resulting in thermal energy dissipation, which can be detected using the present synchronous RF-based thermometry. In addition, depending on the type of defect, the system's signal optimization function may aid in ensuring fine defect resolution. According to the present disclosure, the system may advantageously operate to induce dielectric relaxation loss for fault isolation at frequencies ranging from approximately 50 kHz to 50 GHz, and a power ranging from 1 mW to 10 W.

Using the present system, a periodically modulated synchronized RF input signal may generate a fluctuation in the surface temperature of a DUT over a defect location, given by the equation:

$$F(t) = A \sin(2\pi f_{sync} t + \phi),$$

where "A" is the signal amplitude, "$f_{sync}$" is the synchronization frequency (e.g., 1-25 Hz), "t" is the time and "φ" is the phase shift from the source location.

In another aspect, an in-phase acquisition/detection function (as opposed to the amplitude function that provides information regarding the intensity of thermal energy dissipated) may be provided in the present system through specialized software and hardware controls, which may be independent of a dielectric material's thermal emissivity. Specifically, the intensity-normalized conductive and dielectric thermal losses within a trace line for a circuit may be used to visualize signal propagation paths using the present system's in-phase acquisition function.

According to the present disclosure, failure analysis using RF-based thermometry includes a system having an RF signal generation module, a movable RF probe coupled to the RF signal generation module, a thermal imaging sensor, and a signal phase synchronization module coupled to the thermal sensor and the RF signal generation module to provide high-frequency in-phase RF signals to locate defects in a semiconductor device.

These and other advantages and features of the aspects herein disclosed will be apparent through reference to the following description and the accompanying drawings. Furthermore, it is to be understood that the features of the various aspects described herein are not mutually exclusive and can exist in various combinations and permutations.

Figure 1:
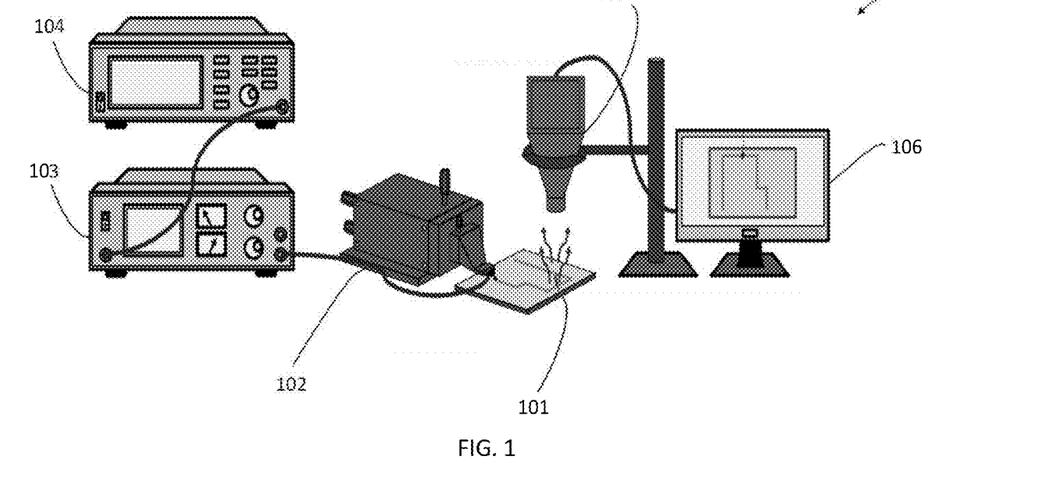
FIG. 1 shows an exemplary representation of certain components for an integrated system or device for failure analysis using synchronized RF-based thermometry according to an aspect of the present disclosure.

As shown in FIG. 1, an exemplary representation of certain components used for an integrated system or device for failure analysis using synchronized RF-based thermometry according to the present disclosure. In this aspect, a device under test (DUT) 101, which may be a prototype device or a production device chosen for testing, may have synchronous amplified RF signals, which are set at an optimized frequency and power depending on the device architecture, length of the structure being investigated and type of dielectric material surrounding it, applied by an RF applicator 102 having fine pitch probe that is coupled to the DUT 101. The RF signals propagate through traces in the DUT 101 and, at the location of an open failure, a thermal signature is generated due to dielectric heating.

In an aspect, the synchronous RF signal may be generated by an RF signal generator 104 and a signal amplifier 103. A thermal signature may be generated by a defect on the DUT 101 that may be detected by a thermal imaging sensor 105. The RF signal may be synchronized at a specific frequency ($f_{sync}$) be in-phase with the thermal imaging sensor 105 to achieve the detection capability of the present disclosure. In an aspect, the thermal imaging sensor may have a detection resolution in the range of approximately 10 μK to 15 mK and may have imaging lenses that operate in different regions of the infrared spectrum. According to the present disclosure, a high-frequency signal up to 10 GHz may be generated from the RF signal generator 104, and this signal amplified to a desired level using the signal amplifier 103 and transmitted to an RF applicator 102.

In another aspect, a processor/tester device (not shown) may provide instructions coupling the generation of in-phase RF signals by the RF signal generator 104 to the thermal imaging sensor 105 to locate defects in the DUT 101, with visual images being provided on a display 106.

In yet another aspect, the present system for synchronized RF-based thermometry may include an auxiliary visual inspection tool, including, for example, an optical microscope.

Figure 2:
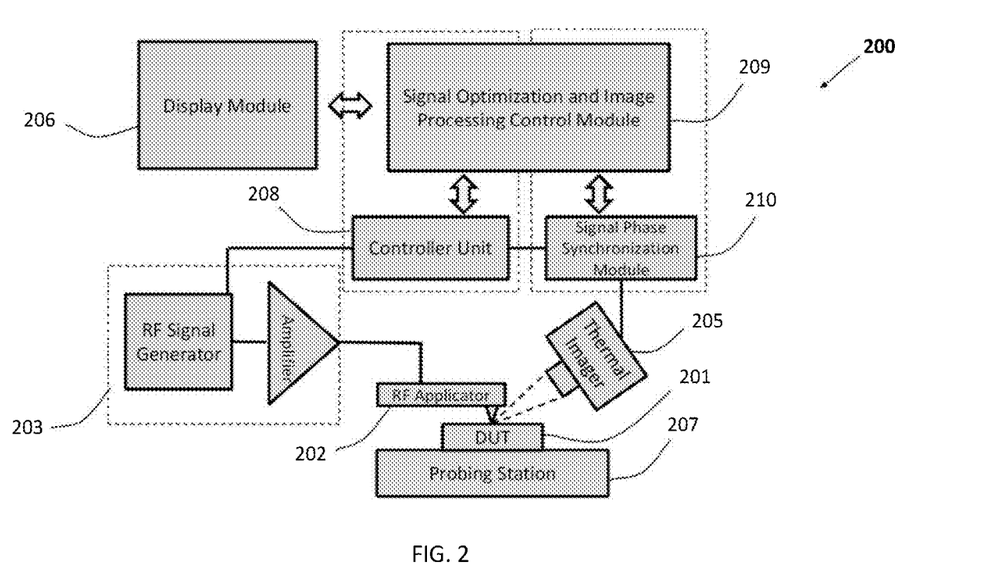
FIG. 2 shows an exemplary representation of functional modules for an integrated system or device for failure analysis using synchronized RF-based thermometry according to another aspect of the present disclosure.

FIG. 2 shows an exemplary representation of functional modules for an integrated system or device for failure analysis using synchronized RF-based thermometry according to an aspect of the present disclosure. According to this aspect, a fully integrated system 200 may be shown as a block diagram with its functional capabilities, which may be enabled by hardware, software, or a combination thereof. The key modules include an RF signal generation module 203, including separate RF signal generator and amplifier units, a controller unit 208, a signal phase synchronization module 210. In another aspect, the system 200 may include a signal optimization and image processing control module 209 that functions together with the controller unit 208 and signal phase synchronization module 210. In another aspect, the RF signal generation module 203 may include an RF generator circuit, an amplifier circuit, and a phase modulation circuit as a single unit.

In addition, as shown in FIG. 2, an RF applicator 202 having fine-pitch probing capability may be paired with a thermal imager/sensor 205 to inspect a DUT 201 positioned on a probing station 207. In a further aspect, a display module 206 may provide visual images of the inspection of DUT 201 with signal synchronization, including having an image generation circuit for providing visual images of the locations of defects. The RF signal generation module 203 may provide high-frequency in-phase RF signals to locate defects in the DUT 201. In a further aspect, the signal phase synchronization module 210 and image processing control module 209 may switchably generate amplitude images and phase images to locate defects in the semiconductor device.

Figure 3:
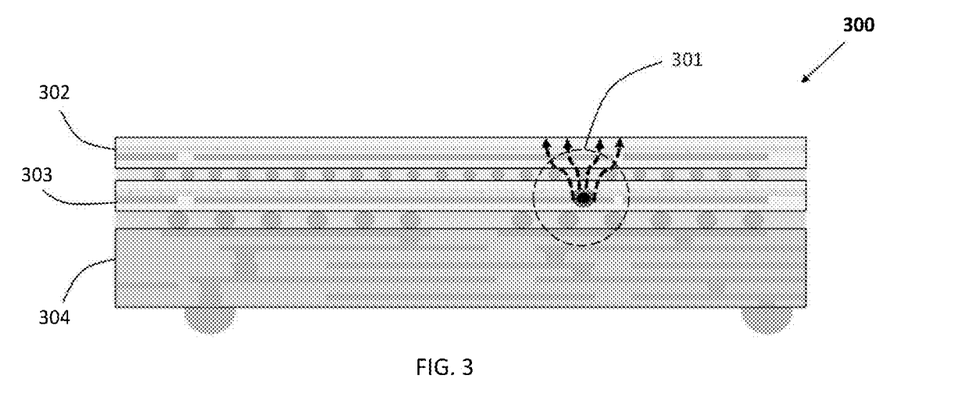
FIG. 3 shows a cross-section view of a heterogeneous computing device with a defect according to an aspect of the present disclosure.

In an aspect shown in FIG. 3, a cross-section view of a heterogeneous computing device provides an illustrative example of a defect 301 that is buried in a complex semiconductor package 300. The semiconductor package 300 has a first device 303 and second device 302 that are connected to a package substrate 304. The present disclosure providing methods and devices for failure analysis using RF-based thermometry is directed to such a device and those set forth in the accompanying figures.

Figure 4:
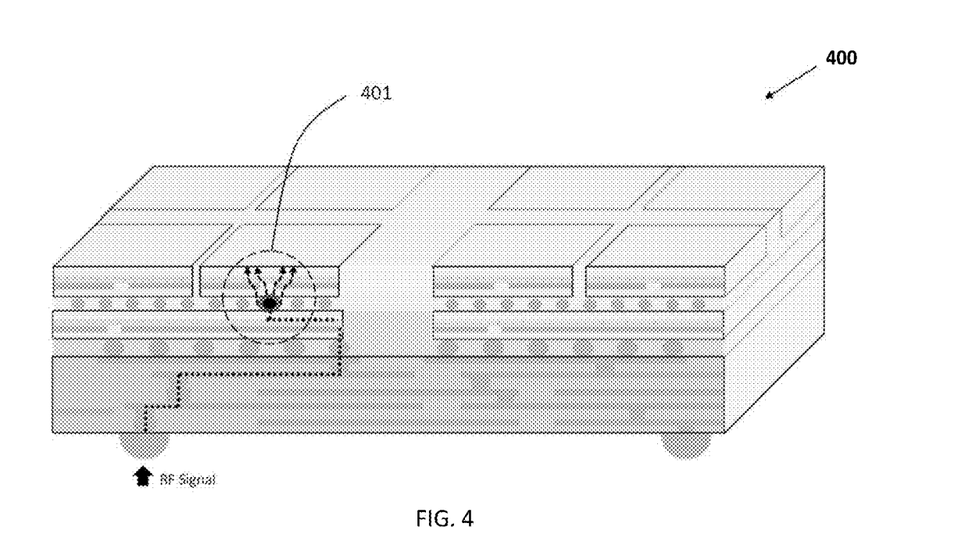
FIG. 4 shows a perspective view of another heterogeneous computing device with a defect according to another aspect of the present disclosure.

FIG. 4 shows a perspective view of another heterogeneous computing device that provides an illustrative example of a defect 401 at an interconnect that is buried in a horizontally and vertically integrated die architecture in a semiconductor package 400 that may also be tested according to the present disclosure.

Figure 5:
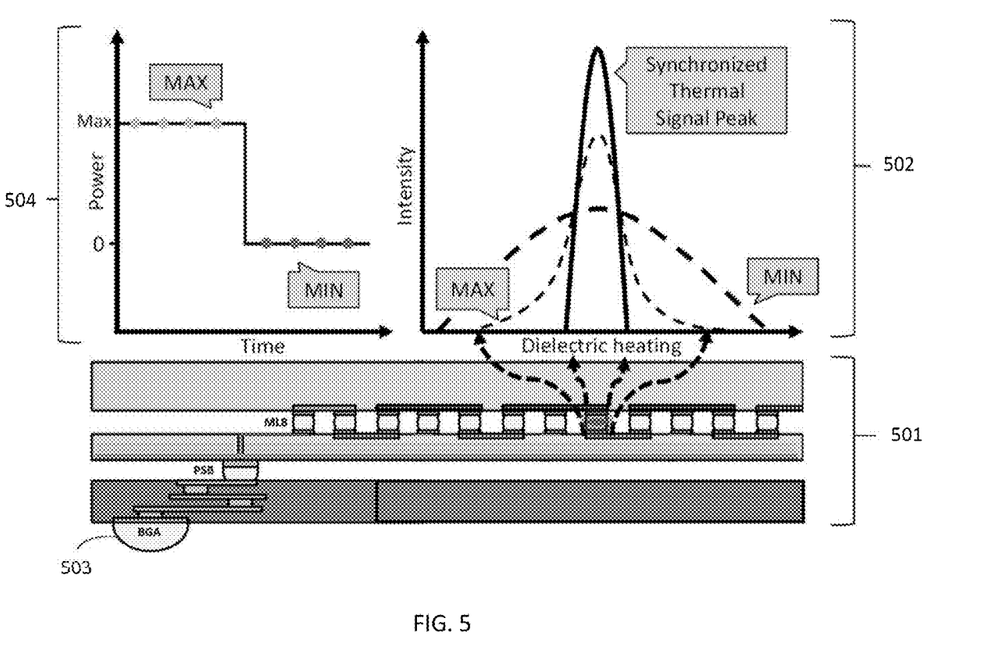
FIG. 5 shows a heterogeneous computing device under test and graphical representations of a generated RF signal that may be synchronized and a thermal heat signature from a defect according to another aspect of the present disclosure.

FIG. 5 shows a heterogeneous computing device under test 501 and a graphical representation 502 of a thermal heat signature from a defect and 504 of a generated RF signal that may be synchronized according to another aspect of the present disclosure. The graph 502 shows that the present system may provide greater resolution for detecting a defect when a synchronous RF signal is applied to a solder ball 503. The graph 504 shows the generated RF signal that may be generated for detecting the defect according to the present disclosure.

Figure 6:
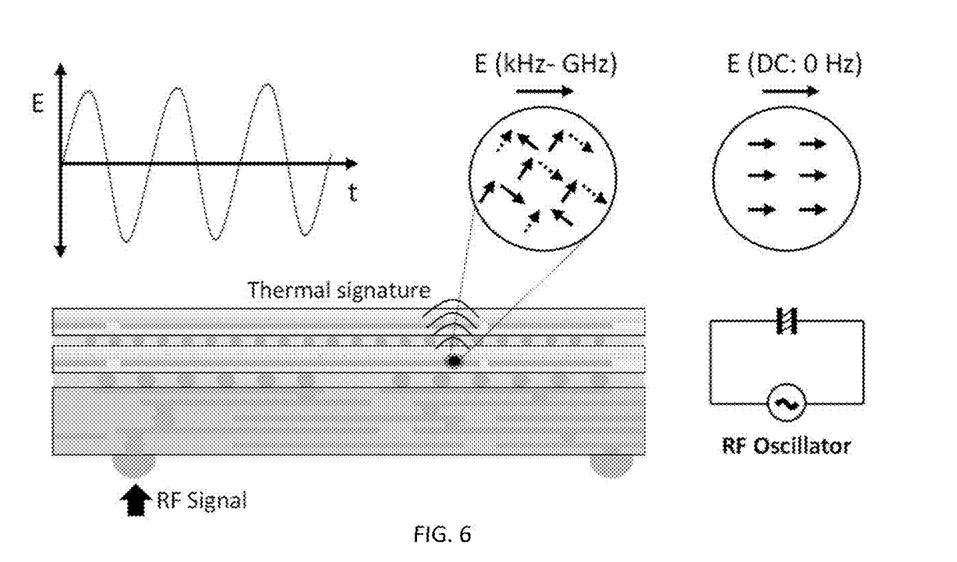
FIG. 6 shows a heterogeneous computing device under test and an illustration of a dipole moment leading to dielectric relaxation at a defect location according to yet another aspect of the present disclosure.

As shown in FIG. 6, a heterogeneous computing device under test may generate a thermal signature caused by inducing polarization in dielectric material at a defect location that is followed by dielectric relaxation. In the representative illustrations in FIG. 6, the dielectric relaxation loss causes heating at the electrical defect (e.g., a "hard open" in an electrical circuit) location as a result of an applied a synchronized RF signal. The dielectric material at the defect location behaves like a capacitor, which leads to a thermal response when subjected to a time-dependent electric field.

Figure 7:
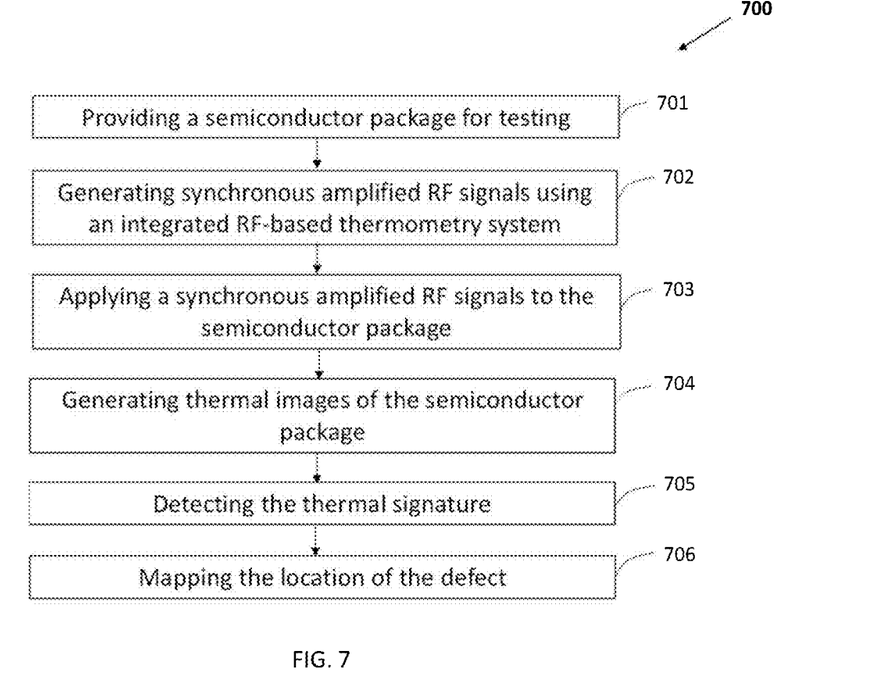
FIG. 7 shows a simplified flow diagram for an exemplary method according to an aspect of the present disclosure.

FIG. 7 shows a simplified flow diagram for an exemplary method according to an aspect of the present disclosure. It is a standard procedure for semiconductor packages to be subjected to extensive test routines to identify electrically failing structures and then tested further to isolate the failures. In an aspect, step 701 is directed to providing a semiconductor package for testing, followed by step 702 that provides for generating synchronous amplified RF signals using the present integrated RF-based thermometry system. Thereafter, step 703 provides for applying the synchronous amplified RF signals to the semiconductor package under test. In an aspect, the duration of a typical test may be on the order of minutes to stabilize the acquired thermal signature. In step 704, thermal images of the semiconductor package under test are generated, including thermal signatures from any defects or failures that may be present. The thermal signature for the defects may be detected in step 705 using a thermal imaging sensor and their locations may be mapped by the system in step 706.

The foregoing aspect providing a method for failure analysis using RF-based thermometry are intended to be non-limiting. It will be apparent to those ordinary skilled practitioners that the foregoing process operations may be modified without departing from the spirit of the present disclosure.

Figure 8:
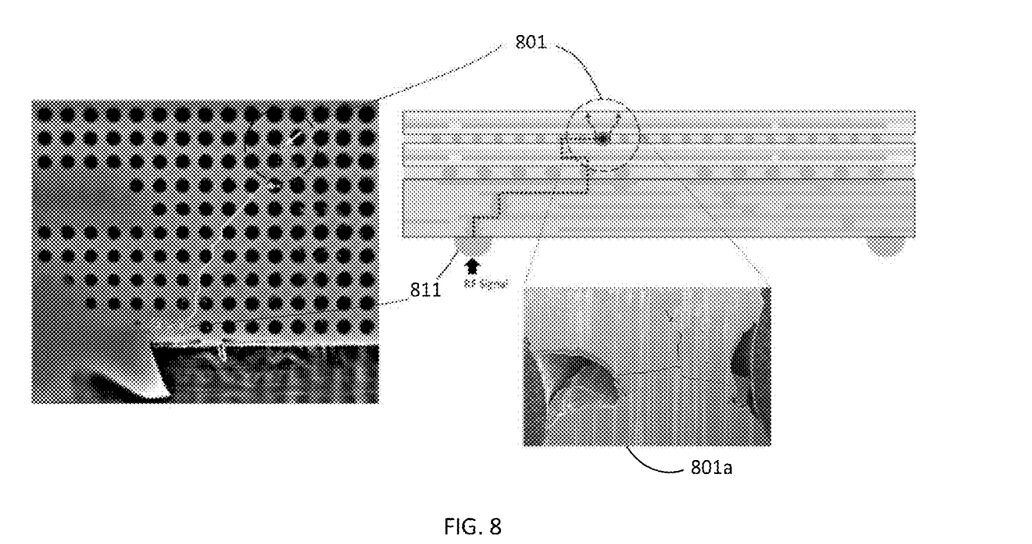
FIG. 8 shows a scanning electron microscope (SEM) and an optical image of a defect and an illustrative thermal signal path for a heterogeneous computing device under test according to an aspect of the present disclosure.

FIG. 8 shows illustrative images of a defect, including a scanning electron microscope (SEM) image and an optical image of the defect, and a thermal signal path for a heterogeneous computing device under test according to an aspect of the present disclosure. The present system may enable fault isolation for semiconductor packages with die-to-die interconnect defects and failures. In an aspect, a die-to-die interconnect defect 801 may be detected when a synchronized RF signal is inputted to solder ball 811, and the SEM image 801a showing the defect 801. In an aspect with ancillary detection steps, a DUT may be de-capsulated and optical microscopes or a scanning electron microscope can be used to evaluate physical anomalies, damaged areas, or electrically overstressed areas, i.e., defects and failures. Also, SEM may be used to perform voltage contrast and electron beam induced current (EBIC) analysis of devices under biased conditions.

Figure 9:
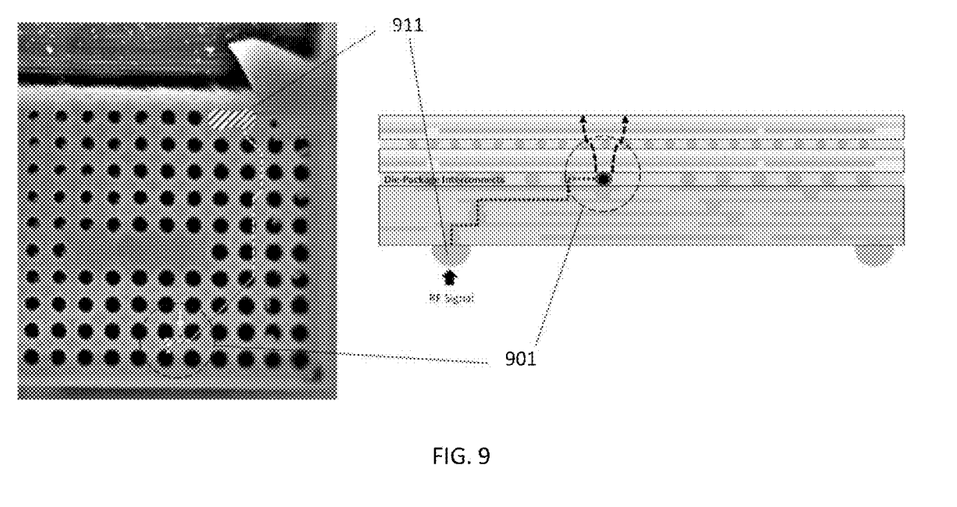
FIG. 9 shows an optical image of another defect and an illustrative thermal signal path in a heterogeneous computing device under test according to another aspect of the present disclosure.

FIG. 9 shows illustrative images of a defect and of a thermal signal path for a heterogeneous computing device under test according to an aspect of the present disclosure. The present system may enable fault isolation for semiconductor packages with die-to-package interconnect defects and failures. In an aspect, a die-to-package interconnect defect 901 may be detected when a synchronized RF signal is inputted to solder ball 911.

Figure 10:
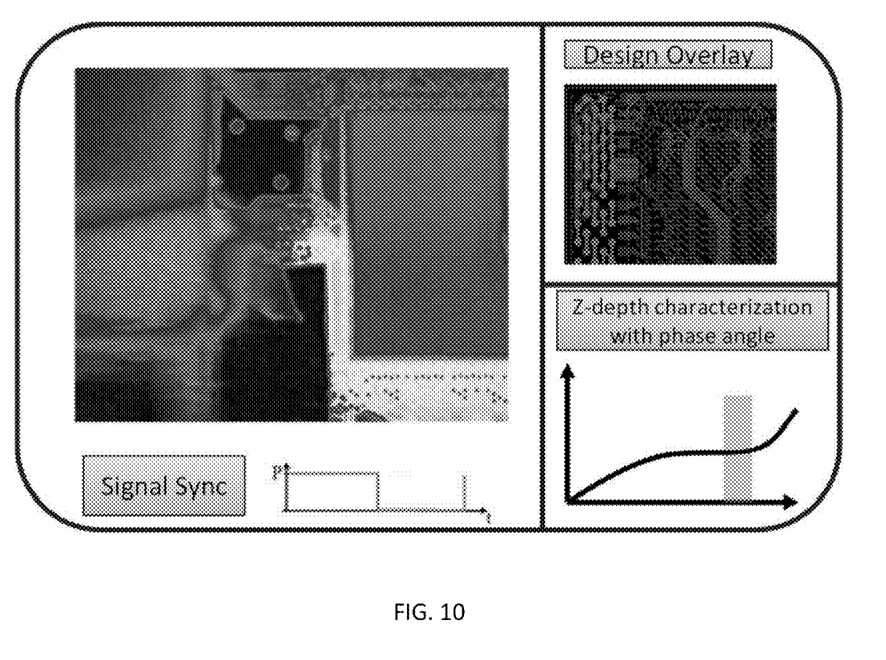
FIG. 10 shows exemplary data relating to failure analysis using synchronized RF-based thermometry according to yet another aspect of the present disclosure.

FIG. 10 shows exemplary data relating to failure analysis using synchronized RF-based thermometry that may be provided by the present system, including defect isolation based on thermal signature with design overlay, Z-depth characterization, signal optimization, according to another aspect of the present disclosure.

Figure 11:
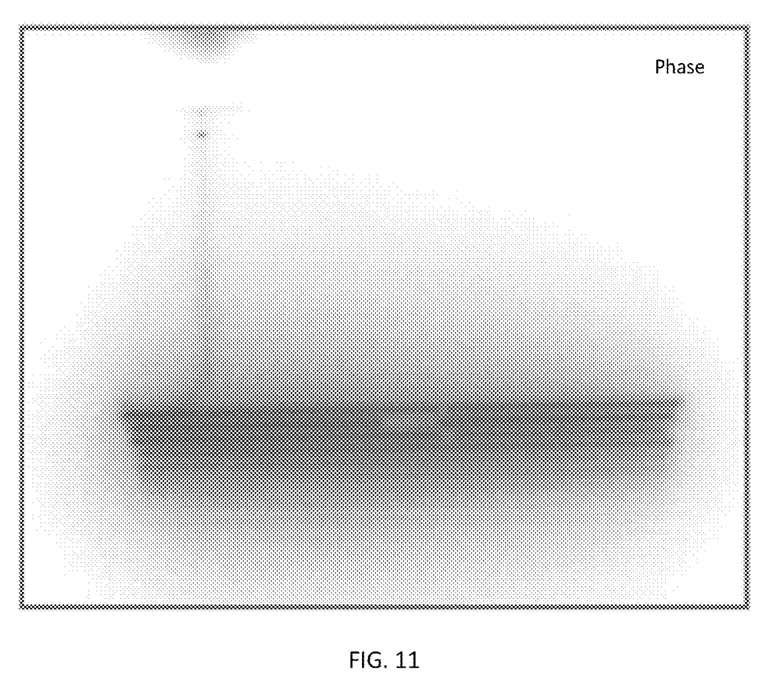
FIG. 11 shows a thermal image of a visualized signal path for a defect in a heterogeneous computing device under test according to a further aspect of the present disclosure.

FIG. 11 shows a thermal image of a visualized signal path of a structure leading up to a defect in a heterogeneous computing device under test using synchronized RF-based thermometry according to a further aspect of the present disclosure. This form of dynamic synchronized RF-based thermometry provides better spatial resolution for a thermal signature when mapping than conventional steady-state approaches.

To more readily understand and put into practical effect the present method and device for failure analysis using RF-based thermometry, particular aspects will now be described by way of examples. For the sake of brevity, duplicate descriptions of features and properties may be omitted.

EXAMPLES

Example 1 may include a system having a radio frequency signal generation module, a movable radio frequency probe coupled to the radio frequency signal generation module, a thermal imaging sensor, and a signal phase synchronization module coupled to the thermal sensor and the radio frequency signal generation module to provide high-frequency in-phase radio frequency signals to locate defects in a semiconductor device.

Example 2 may include the system of example 1 and/or any other example disclosed herein, in which the radio frequency signal generation module further includes an amplifier circuit and phase modulation circuit.

Example 3 may include the system of example 2 and/or any other example disclosed herein, in which the radio frequency signal generation module switchably generates radio frequency signals to transmit to the radio frequency probe for producing amplitude images and phase images to locate defects in the semiconductor device.

Example 4 may include the system of example 1 and/or any other example disclosed herein, in which the system provides thermal phase measurements.

Example 5 may include the system of example 1 and/or any other example disclosed herein, in which the high-frequency signal is in the range of approximately 50 kHz to 50 GHz.

Example 6 may include the system of example 1 and/or any other example disclosed herein, in which the signal phase synchronization module coupled to a controller unit to provide synchronization signals to the radio frequency signal generation module and the thermal imaging sensor.

Example 7 may include the system of example 1 and/or any other example disclosed herein, in which the thermal imaging sensor further includes imaging lenses that operate in different regions of the infrared spectrum.

Example 8 may include the system of example 1 and/or any other example disclosed herein, further including a display module having an image generation circuit for providing visual images of the locations of defects.

Example 9 may include a method for providing an integrated radio frequency thermometry system for generating synchronous amplified radio frequency signals, providing a selected semiconductor device for defect testing, applying the synchronous amplified radio frequency signals to the semiconductor device, generating thermal images of the semiconductor device to detect a thermal signature from the defect in the semiconductor device, and mapping the location of the defect.

Example 10 may include the method of example 9 and/or any other example disclosed herein, in which the thermal signature is generated by synchronized RF-induced dielectric relaxation.

Example 11 may include the method of example 9 and/or any other example disclosed herein, in which the integrated radio frequency thermometry system further includes a radio frequency signal generation module for generating synchronous amplified radio frequency signals, a movable radio frequency probe for applying the synchronous amplified radio frequency signals to the semiconductor device, a thermal imaging sensor for generating thermal images of the semiconductor device to detect a thermal signature from defect in the semiconductor device, and a signal phase synchronization module coupled to the thermal imaging sensor and the radio frequency signal generation module to provide high-frequency in-phase radio frequency signals to locate the defects in the semiconductor device.

Example 12 may include the method of example 9 and/or any other example disclosed herein, in which mapping the location of the defect further includes providing a 3D location for the defect by thermal phase measurements.

Example 13 may include the method of example 9 and/or any other example disclosed herein, in which mapping the location of the defect further includes providing a visualization of a signal path using radio frequency thermometry to identify anomalies in a circuit.

Example 14 may include the method of example 12 and/or any other example disclosed herein, in which the 3D location provided within a range of approximately 1 to 5 μm.

Example 15 may include the method of example 9 and/or any other example disclosed herein, in which the device under testing further includes a heterogeneous semiconductor structure.

Example 16 may include the method of example 9 and/or any other example disclosed herein, in which the defect testing is non-destructive.

Example 17 may include a non-transitory computer-readable medium for execution by a computing device to control an RF-based thermometry system for non-destructive defect isolation in a semiconductor device for directing a radio frequency signal generation module to generate a synchronous amplified radio frequency signal, determining a synchronous amplified radio frequency signal output to a movable radio frequency probe, determining a supply power for a thermal imaging sensor, collecting data for a thermal signature from a defect in a semiconductor device, and generating a thermal imaging map of the defect in the semiconductor device.

Example 18 may include the non-transitory computer-readable medium of example 17 and/or any other example disclosed herein, further including performing signal optimization to provide high-frequency in-phase radio frequency signals to locate the defects in the semiconductor device.

Example 19 may include the non-transitory computer-readable medium of example 17 and/or any other example disclosed herein, in which generating thermal images of the defect further includes image processing of the thermal signature from the defect in the semiconductor device to provide a 3D location of the defect.

Example 20 may include the non-transitory computer-readable medium of example 17 and/or any other example disclosed herein, in which generating thermal images of the defect further includes image processing of the thermal signature from the defect in the semiconductor device for display of the thermal imaging map.

It will be understood that any property described herein for a specific device may also hold for any device described herein. It will also be understood that any property described herein for a specific method may hold for any of the methods described herein. Furthermore, it will be understood that for any device or method described herein, not necessarily all the components or operations described will be enclosed in the device or method, but only some (but not all) components or operations may be enclosed.

The term "comprising" shall be understood to have a broad meaning similar to the term "including" and will be understood to imply the inclusion of a stated integer or operation or group of integers or operations but not the exclusion of any other integer or operation or group of integers or operations. This definition also applies to variations on the term "comprising" such as "comprise" and "comprises".

The term "coupled" (or "connected") herein may be understood as electrically coupled or as mechanically coupled, e.g., attached or fixed or attached, or just in contact without any fixation, and it will be understood that both direct coupling or indirect coupling (in other words: coupling without direct contact) may be provided.

While the present disclosure has been particularly shown and described with reference to specific aspects, it should be understood by those skilled in the art that various changes in form and detail may be made therein without departing from the spirit and scope of the present disclosure as defined by the appended claims. The scope of the present disclosure is thus indicated by the appended claims and all changes which come within the meaning and range of equivalency of the claims are therefore intended to be embraced.

What is claimed is:

1. A system comprising:
   a radio frequency signal generation module;
   a movable radio frequency probe coupled to the radio frequency signal generation module;
   a thermal imaging sensor; and
   a signal phase synchronization module coupled to the thermal imaging sensor and the radio frequency signal generation module to provide high-frequency in-phase radio frequency signals to locate defects in a semiconductor device.

2. The system of claim 1, wherein the radio frequency signal generation module further comprises an amplifier circuit and phase modulation circuit.

3. The system of claim 2, wherein the radio frequency signal generation module switchably generates radio frequency signals to transmit to the moveable radio frequency probe for producing amplitude images and phase images to locate defects in the semiconductor device.

4. The system of claim 1, wherein the system provides thermal phase measurements.

5. The system of claim 1, wherein the high-frequency in-phase radio frequency signals are in the range of approximately 50 kHz to 50 GHz.

6. The system of claim 1, further comprising the signal phase synchronization module being coupled to a controller unit to provide synchronization signals to the radio frequency signal generation module and the thermal imaging sensor.

7. The system of claim 1, wherein the thermal imaging sensor further comprises imaging lenses that operate in different regions of the infrared spectrum.

8. The system of claim 1, further comprising a display module having an image generation circuit for providing visual images of the located defects.

9. A method comprising:
   providing an integrated radio frequency thermometry system for generating synchronous amplified radio frequency signals;
   providing a selected semiconductor device for defect testing;
   applying the synchronous amplified radio frequency signals to the semiconductor device;
   generating thermal images of the semiconductor device to detect a thermal signature from a defect in the semiconductor device; and
   mapping the location of the defect.

10. The method of claim 9, wherein the thermal signature is generated by synchronized RF-induced dielectric relaxation.

11. The method of claim 9, wherein the integrated radio frequency thermometry system further comprises:
    a radio frequency signal generation module for generating synchronous amplified radio frequency signals;
    a movable radio frequency probe for applying the synchronous amplified radio frequency signals to the semiconductor device;
    a thermal imaging sensor for generating thermal images of the semiconductor device to detect a thermal signature from the defect in the semiconductor device; and
    a signal phase synchronization module coupled to the thermal imaging sensor and the radio frequency signal generation module to provide high-frequency in-phase radio frequency signals to locate the defect in the semiconductor device.

12. The method of claim 9, wherein mapping the location of the defect further comprises providing a three-dimensional location for the defect by thermal phase measurements.

13. The method of claim 9, wherein mapping the location of the defect further comprises providing a visualization of a signal path using radio frequency thermometry to identify anomalies in a circuit.

14. The method of claim 12, wherein the three-dimensional location provided within a range of approximately 1 to 5 μm.

15. The method of claim 9, wherein a device under testing further comprises a heterogeneous semiconductor structure.

16. The method of claim 9, wherein the defect testing is non-destructive.

17. A non-transitory computer-readable medium for execution by a computing device to control an RF-based thermometry system for non-destructive defect isolation in a semiconductor device comprising:
    directing a radio frequency signal generation module to generate a synchronous amplified radio frequency signal;
    determining a synchronous amplified radio frequency signal output to a movable radio frequency probe;
    determining a supply power for a thermal imaging sensor;
    collecting data for a thermal signature from a defect in the semiconductor device; and
    generating a thermal imaging map of the defect in the semiconductor device.

18. The non-transitory computer-readable medium of claim 17, further comprising:
    performing signal optimization to provide high-frequency in-phase radio frequency signals to locate the defect in the semiconductor device.

19. The non-transitory computer-readable medium of claim 17, wherein generating thermal images of the defect further comprises image processing of the thermal signature from the defect in the semiconductor device to provide a three-dimensional location of the defect.

20. The non-transitory computer-readable medium of claim 17, wherein generating thermal images of the defect further comprises image processing of the thermal signature from the defect in the semiconductor device for display of the thermal imaging map.

* * * * *